United States Patent
Keller et al.

(10) Patent No.: US 12,159,929 B1
(45) Date of Patent: Dec. 3, 2024

(54) HIGH MOBILITY GROUP-III NITRIDE TRANSISTORS WITH STRAINED CHANNELS

(71) Applicant: The Regents of the University of California, Oakland, CA (US)

(72) Inventors: Stacia Keller, Santa Barbara, CA (US); Umesh K. Mishra, Montecito, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 103 days.

(21) Appl. No.: 17/114,307

(22) Filed: Dec. 7, 2020

Related U.S. Application Data

(60) Provisional application No. 62/944,629, filed on Dec. 6, 2019.

(51) Int. Cl.
| | |
|---|---|
| H01L 29/778 | (2006.01) |
| H01L 29/10 | (2006.01) |
| H01L 29/15 | (2006.01) |
| H01L 29/20 | (2006.01) |
| H01L 29/205 | (2006.01) |
| H01L 29/66 | (2006.01) |

(52) U.S. Cl.
CPC ...... *H01L 29/7781* (2013.01); *H01L 29/1029* (2013.01); *H01L 29/151* (2013.01); *H01L 29/2003* (2013.01); *H01L 29/205* (2013.01); *H01L 29/66462* (2013.01)

(58) Field of Classification Search
None
See application file for complete search history.

(56) References Cited

U.S. PATENT DOCUMENTS

| | | | | |
|---|---|---|---|---|
| 2006/0244011 A1* | 11/2006 | Saxler | ............... | H01L 29/7783 257/E29.249 |
| 2009/0275190 A1* | 11/2009 | Han | ............... | C30B 29/406 438/481 |
| 2010/0224852 A1* | 9/2010 | McLaurin | ............... | H01L 33/32 257/14 |
| 2011/0147706 A1* | 6/2011 | Radosavljevic | ... | H01L 29/7783 257/E21.403 |
| 2011/0180854 A1* | 7/2011 | Ramdani | ............... | H01L 29/225 257/E21.403 |

(Continued)

OTHER PUBLICATIONS

Dasgupta et al., "Ultralow nonalloyed Ohmic contact resistance to self aligned N-polar GaN high electron mobility transistors by In(Ga)N regrowth". Appl. Phys. Lett. 96 (2010) pp. 143504-1 to 143504-3.

(Continued)

*Primary Examiner* — Khaja Ahmad
(74) *Attorney, Agent, or Firm* — GATES & COOPER LLP

(57) ABSTRACT

An electronic device including a substrate a group III-V layer on or above the substrate, wherein the III-V layer has an in-plane lattice constant that is greater than that of gallium nitride or wherein the III-V layer is at least partially relaxed; and an active region including a coherently strained group III-V channel layer on or above the III-V layer; wherein electron mobility in the channel layer is increased by the strain. Structures with an in-plane lattice constant that is smaller than that of gallium nitride are used for increasing the hole mobility by strain.

25 Claims, 11 Drawing Sheets

Schematic Structures of nFETs based on N-polar GaN

(56) References Cited

U.S. PATENT DOCUMENTS

| | | | | |
|---|---|---|---|---|
| 2012/0280367 | A1* | 11/2012 | Logiou | H01L 21/76254 257/E29.022 |
| 2012/0319127 | A1* | 12/2012 | Chowdhury | H01L 29/861 257/E29.089 |
| 2013/0099245 | A1* | 4/2013 | Ando | H01L 29/4232 257/190 |
| 2014/0131730 | A1* | 5/2014 | Keller | H01L 31/0735 438/47 |
| 2014/0138614 | A1* | 5/2014 | Sugiyama | H01L 33/12 257/13 |
| 2016/0163846 | A1* | 6/2016 | Liu | C30B 25/02 438/191 |
| 2019/0035895 | A1* | 1/2019 | Xie | H01L 29/0843 |
| 2020/0388701 | A1* | 12/2020 | Hickman | H01L 29/7787 |
| 2024/0128367 | A1* | 4/2024 | Denninghoff | H01L 29/7787 |

OTHER PUBLICATIONS

Hendorfer et al., "g-factor and effective mass anisotropies in pseudomorphic strained layers". Semicond. Sci. Technol. 6 (1991) pp. 595-601.

Hestroffer et al., "Compositionally graded InGaN layers grown on vicinal N-face GaN substrates by plasma-assisted molecular beam epitaxy". J. Cryst. Growth 465 (2017) pp. 55-59.

Hestroffer et al., "Relaxed c-plane InGaN layers for the growth of strain-reduced InGaN quantum wells". Semicond. Sci. technol 30 (2015) 105015, six pages.

Keller et al., "InGaN lattice constant engineering via growth on (In,Ga)N/GaN nanostripe arrays". Semicond. Sci. Technol. 30, 105020 (2015) nine pages.

Keller et al., "Optical and structural properties of GaN nanopillar and nanostripe arrays with embedded InGaN/GaN multi-quantum wells". J. Appl. Phys. 100, pp. 054314-1 to 054314-7 (2006).

Keller et al., "Optical properties of GaN nanopillar and nanostripe arrays with embedded InGaN/GaN multi quantum wells". Phys. Status Solidi Basic Res. 244, pp. 1797-1801 (2007).

Laboutin et al., "InGaN channel high electron mobility transistor structures grown by metal organic chemical vapor deposition". Appl. Phys. Lett. 100 (2012) pp. 121909-1 to 121909-3.

Okamoto et al., "MOCVD-grown InGaN-channel HEMT structures with electron mobility of over 1000 cm2=Vs". J. Cryst. Growth 272 (2004) pp. 278-284.

Romanczyk et al., "Demonstration of Constant 8 W/mm Power Density at 10, 30, and 94 GHz in State-of-the-Art Millimeter-Wave N-Polar GaN MISHEMTs". IEEE Trans. Electron Devices 65. pp. 45-50 (2018).

* cited by examiner

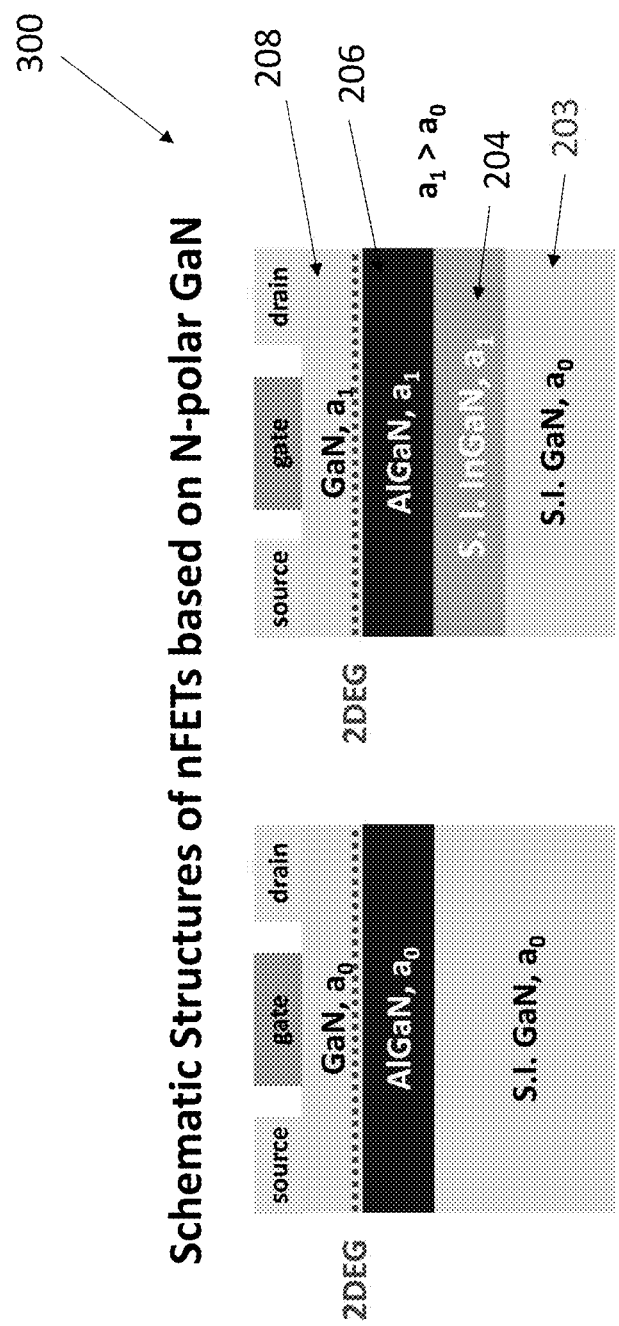

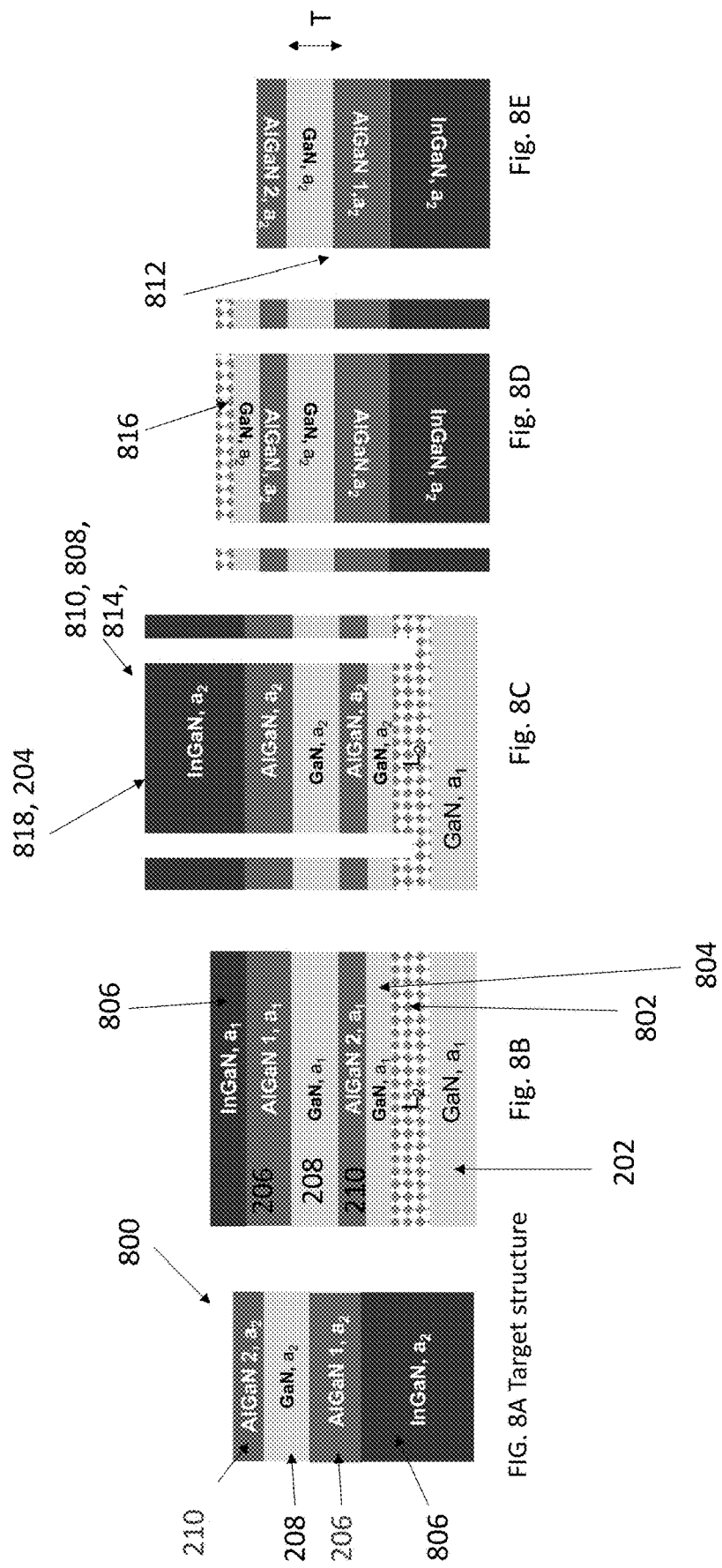

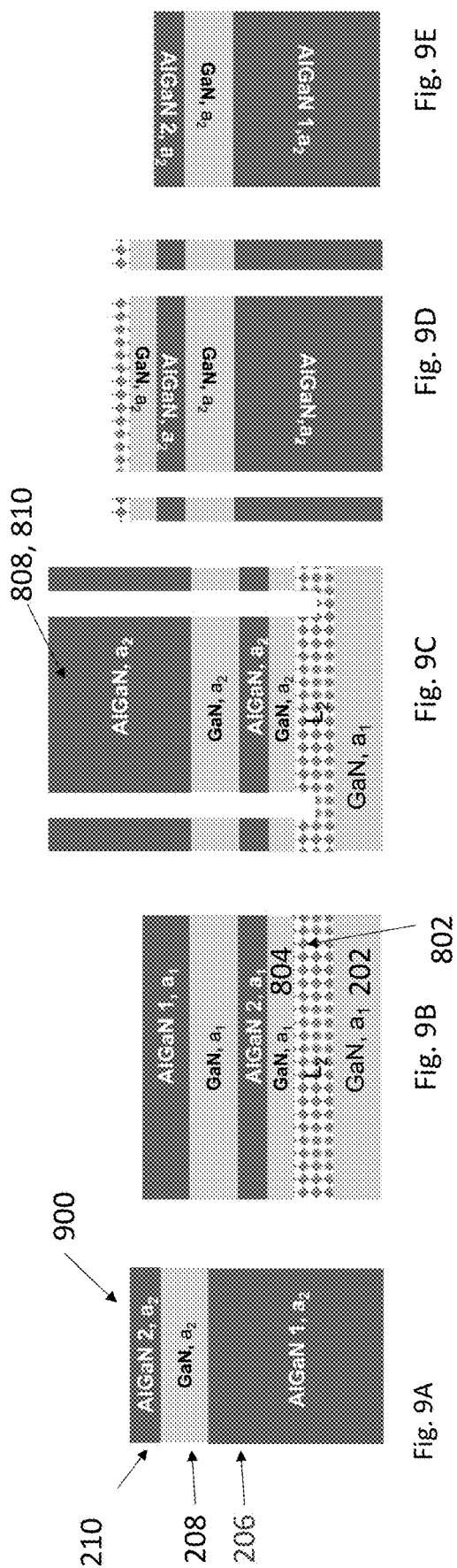

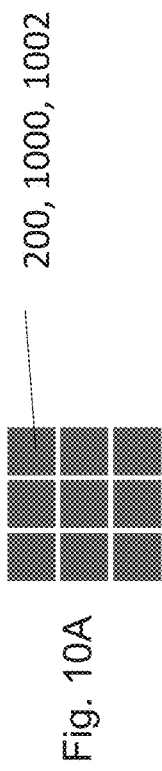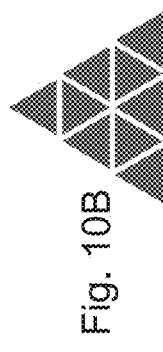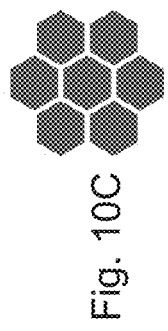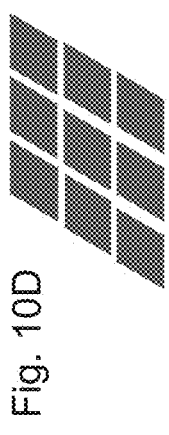

HIGH MOBILITY GROUP-III NITRIDE TRANSISTORS WITH STRAINED CHANNELS

CROSS REFERENCE TO RELATED APPLICATIONS

This application claims the benefit under 35 U.S.C. Section 119(e) of and commonly-assigned U.S. provisional patent application Ser. No. 62/944,629, filed on Dec. 6, 2019, by Stacia Keller and Umesh K. Mishra, entitled "HIGH MOBILITY GROUP-III NITRIDE TRANSISTORS WITH STRAINED CHANNELS," which application is incorporated by reference herein.

STATEMENT REGARDING FEDERALLY SPONSORED RESEARCH AND DEVELOPMENT

This invention was made with Government support through grant nos. N00014-16-1-2250, N00014-16-1-2933, and N00014-17-1-2106 awarded by the United States Office of Naval Research. The Government has certain rights in this invention.

BACKGROUND OF THE INVENTION

1. Field of the Invention

The present invention relates to electronic devices and methods of making the same.

2. Description of the Related Art (Note: This application references a number of different references as indicated throughout the specification by one or more reference numbers in superscripts, e.g.,[x]. A list of these different publications ordered according to these reference numbers can be found below in the section entitled "References." Each of these publications is incorporated by reference herein.

III-Nitride (III-N) based structures are widely used for photonic and electronic devices. Specifically, transistors based on N-polar GaN have recently gained attention because of their outstanding performance at high operation frequencies demonstrating an output power of 8 W/mm at 94 GHz [1]. However, device performance needs to be improved to meet demands of commercial applications. The present disclosure satisfies this need.

SUMMARY OF THE INVENTION

The present disclosure describes the use of strain to improve the performance of group III-V (e.g., III-Nitride) devices (e.g., electronic devices). In one example, the present invention uses strain to enhance the electron or hole mobility in III-Nitride transistors (e.g., field effect transistors (FETs) and high electron mobility transistors).

Example devices and methods include, but are not limited to, the following.

1. A device, comprising:
   a group III-V layer wherein the III-V layer has an in-plane lattice constant that is larger or smaller than that of gallium nitride and wherein the III-V layer is at least partially relaxed; and
   an active region including a coherently strained group III-V channel layer on or above the group III-V layer; wherein an electron mobility or a hole mobility in the channel layer is increased by the strain.

2. The device of example 1, wherein:
   the active region comprises a barrier layer confining a two dimensional electron gas or a two dimensional hole gas in the channel layer,
   the barrier layer comprises at least one of AlN, AlGaN, InAlN, ScAlN or an alloy combination of the AlN, AlGaN, InAlN, ScAlN and the channel layer comprises GaN, where the GaN channel layer is strained and has an in-plane lattice constant larger than in a relaxed state to decrease the effective electron mass or the effective hole mass in the channel layer, or
   the channel layer comprises AlN and the barrier layer comprises BAlN, both the barrier layer and the channel layer strained to GaN to decrease the effective electron or hole masses in the channel layer.

3. The device of example 1 wherein the group III-V layer and the active region comprise (Sc,Y,B,Al,Ga,In)(N,P,As) material and the active region comprises a barrier layer having a higher bandgap than the channel layer.

4. The device of example 1, wherein the active region comprises a barrier layer comprising a III-Nitride including Yttrium or a transition metal nitride, the barrier layer adjacent the channel layer confining a two dimensional electron or hole gas in the channel layer.

5. The device of example 1, wherein the strain in the channel layer is tensile strain or compressive strain.

6. The device of example 1, wherein the device comprises a transistor including a source, a drain, and a gate, the device further comprising:
   a mesa comprising a stripe having a length longer than a width and including the group III-V layer and the active region, wherein the source and the drain are on opposite sides of the stripe and the gate is on top of the stripe, so that the gate controls flow of current through a channel in the channel layer across a width of the stripe between the source and the drain; wherein:
   the stripe is relaxed in the direction perpendicular to the stripe and remains fully strained in a direction parallel to a stripe direction along a length of the stripe,
   the electron or hole transport direction is perpendicular to the stripe (along the relaxed direction),
   the channel layer and/or the III-V layer have a thickness less than the width of the stripe or the fin.

7. The device of example 1, wherein the device comprises a transistor including a source, a drain, and a gate, the device further comprising:
   a mesa comprising a stripe having a length longer than a width and including the group III-V layer and the active region, wherein the source and the drain are on opposite sides of a length of the stripe and the gate is on top of the stripe, so that the gate controls flow of current through the channel along the length of the stripe between the source and the drain; wherein:
   the stripe remains strained or partially strained in the direction parallel to the stripe direction along the length of the stripe or fin and is relaxed in a direction perpendicular to the stripe direction,
   the hole transport direction is parallel to the length of the stripe (along the relaxed direction), and
   the channel layer and/or the III-V layer have a thickness less than the length of the stripe or the fin.

8. The device of example 1, wherein the group III-V layer comprises a multi quantum well and/or the stripe has a width in a range of 1-1000 nanometers.

9. The device of example 1, further comprising a stressor layer on or above the channel layer, the stressor layer having a stressor lattice constant further straining the channel layer so as to change a lattice constant of the channel.

10. The device of example 9, wherein the porous layer comprises gallium nitride and the stressor layer comprises InGaN or AlGaN or a layer comprising two or more of Al, Ga, In, and N.

11. The device of example 9, wherein the stressor layer comprises a material different from InGaN, the group III-V layer comprises III-Nitride having a lattice constant greater than that of gallium nitride, and the channel layer comprises III-Nitride.

12. The device of example 9, further comprising a mesa comprising a stripe or tile etched or formed after deposition of the active region and a cap layer prior to the growth of the stressor layer.

13. The device of example 12, wherein the stressor layer comprises InGaN or AlGaN, and the mesa has a geometry allowing the channel layer that is biaxially strained.

14. The device of example 12, wherein the stressor layer comprises InGaN or AlGaN, and the mesa comprises the stripe allowing the channel layer that is uniaxially strained.

15. The device of example 1, further comprising a porous layer comprising gallium nitride, the group III-V layer grown on the porous layer, and wherein the channel layer comprises gallium nitride or InGaN.

16. The device of example 1, further comprising a porous layer on or above a substrate and the group III-V layer on the porous layer, wherein the channel layer has a thickness greater than a critical thickness for growth of the channel layer directly on the substrate.

17. The device of example 1, further comprising a porous layer comprising pores, patterns or features having a width of 1 nanometers-1000 micrometers, wherein the pores or patterns or features are etched and the group III-V layer is on the porous layer.

18. The device of example 17, further comprising an etched pattern comprising the group III-V layer and the porous layer, wherein the electron and hole transport occurs along any predetermined direction in the etched pattern.

19. The device of any of the examples 1-18, wherein the device comprises an n-type field effect transistor having an N-polar orientation and the active region (including the channel layer and the barrier layer) has the N-polar orientation and the barrier layer is between the channel layer and the group III-V layer.

20. The device of any of the examples 1-18, wherein the device comprises a p-type field effect transistor having a Ga-polar orientation and the active region (including the channel layer and the barrier layer) has the Ga polar orientation and the barrier layer is between the channel layer and the group III-V layer.

21. A method of making a device, comprising:
growing a group III-V layer on or above a substrate, wherein the III-V layer has an in-plane lattice constant that is larger or smaller than that of gallium nitride and wherein the III-V layer is at least partially relaxed; and
growing an active region including a coherently strained group III-V channel layer on or above the group III-V layer; wherein an electron mobility or a hole mobility in the channel layer is increased by the strain.

BRIEF DESCRIPTION OF THE DRAWINGS

Referring now to the drawings in which like reference numbers represent corresponding parts throughout:

FIGS. 3A-3B. Schematic structures of standard N-polar GaN HEMT with relaxed GaN channel (FIG. 3A) and a novel N-polar HEMT with tensile strained GaN channel layer, resulting in a lower electron effective mass and increased electron mobility (FIG. 3B). The bottom GaN layer in 3B is optional.

FIGS. 8A-8E. Example process for making a device using porous gallium nitride (GaN) and using InGaN as stressor in order to decrease the electron effective mass in the tensile strained GaN channel with a channel thickness larger than the critical GaN thickness on InGaN or (In,Al,Ga)N, showing cross-sectional schematics wherein FIG. 8A shows a target structure example formed by the steps illustrated in FIGS. 8B-8E, FIG. 8B illustrating the top section of the target structure is first grown strained to GaN on top of a porous GaN layer, which was possibly covered with a thin GaN layer, FIG. 8C showing afterwards patterns are etched down to or into the porous GaN layers and the remainder of the structure is grown, here as example a thick InGaN layer (the thick InGaN layer makes the entire structure to adopt a lattice constant equal or close to the thick InGaN layer, resulting in a strained GaN channel), FIG. 8D showing the layer stack on top of the porous layer is removed via peeling, for example, and transferred on top of a wafer with desired properties, and FIG. 8E shows the remainder of the porous GaN layer and possibly the thin GaN cap layer are removed via etching. A stripe pattern can be used for applications with uniaxially strained channel and tile patterns (any geometry) can be used for a biaxial strained channel.

FIGS. 9A-9E. Stripe patterns for uniaxial relaxation to form light holes in the GaN channel with a channel thickness larger than the critical thickness on AlGaN or AlN, showing cross-sectional schematics wherein FIG. 9A shows a target structure example, FIGS. 9B-9E showing the fabrication steps to form the structure of FIG. 9A, FIG. 9B showing the top section of the target structure is first grown strained to GaN on top of a porous GaN layer, which was possibly covered with a thin GaN layer, FIG. 9C showing afterwards patterns are etched down to or into the porous GaN layer and the remainder of the structure is grown, here as example a thick AlGaN or AlN layer (the thick (Al,Ga)N layer makes the entire structure to adopt a lattice constant equal or close to the thick (Al,Ga)N layer, resulting in a strained GaN channel), FIG. 9D showing the layer stack on top of the porous layer is removed via peeling, for example, and transferred on top of a wafer with desired properties, and FIG. 9E showing the remainder of the porous GaN layer and possibly the thin GaN cap are removed via etching. A tile pattern (any pattern) can be used for applications with biaxially strained channel.

FIG. 10A-10E. Top view of devices including example tile and tile patterns, wherein FIG. 10A illustrates square tiles and patterns, FIG. 10B illustrates triangular tiles and tile patterns, FIG. 10C illustrated hexagonal tiles and tile patterns, and FIG. 10D illustrates trapezoidal tiles and tile patterns.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

First Example

Figure 1:
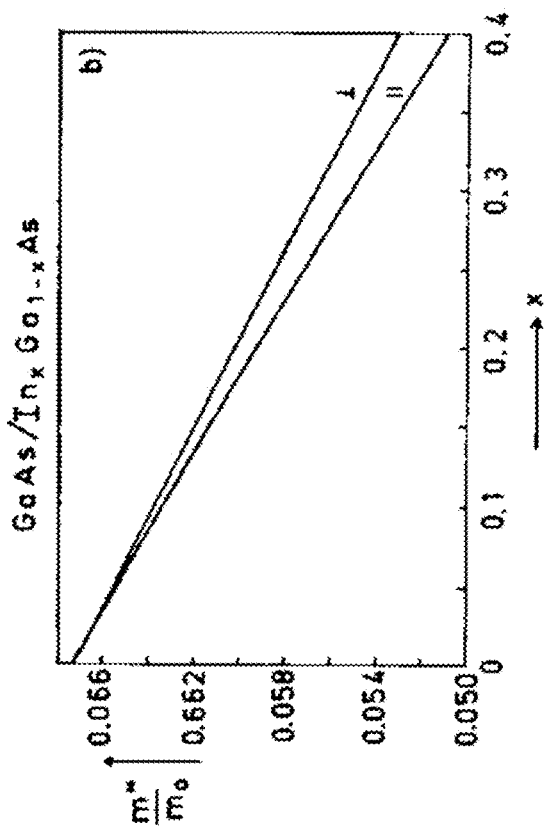
FIG. 1. Effective mass of coherently strained GaAs on $In_xGa_{1-x}As$ versus x [2].

To further boost the performance of III-Nitride transistors, the present disclosure describes structures with tensile strain in the channel layer to decrease the effective mass of the channel electrons (or holes in the case of a p-FET), as illustrated in FIG. 1 for GaAs layers grown strained on InGaAs [2]. The lower effective mass results in an increase in electron or hole mobility.

In one or more examples, a binary channel layer under tensile strain is preferred over a ternary material with larger lattice constant, because of the typically observed reduction in carrier mobility in alloys compared to binary materials. For example, the electron mobility in AlGaN/$In_{0.1}Ga_{0.9}N$ HEMTs was observed to be more than 40% lower compared to AlGaN/GaN HEMTs [3, 4]. Alloy scattering in InGaN is especially prominent due to alloy fluctuations in InGaN materials.

In one or more examples, a method according to embodiments described herein can be applied to any transistor structure with a backbarrier, independent of polarity and type of carrier in the channel layer.

As example, a N-polar HEMT design is used, the HEMT 200 comprising a substrate or base layer 202 (e.g., comprising SiC), a first layer 204 (e.g., buffer layer, e.g., GaN buffer) on the substrate, a barrier layer 206 on the buffer layer (e.g., AlGaN backbarrier layer), the barrier providing charge and channel (e.g., 2DEG) confinement in the channel layer 208 (e.g., GaN channel) on the buffer layer 204, a first cap layer 210 (e.g., AlGaN cap) on the channel layer, a second cap layer 212 (e.g., GaN cap) on the first cap layer in the channel layer by the barrier, a recess 213 in the second cap layer and a layer 214 (e.g., SiN or 5 nm MOCVD grown SiN layer) in the recess, gate G deposited in the recess on top of the layer 214 so that a portion of the layer 214 is between the first cap layer and the gate, regrown (e.g., by MBE) n+ material 216 directly contacting the channel layer 208, and source (S) and drain (D) contacts to the n+ material.

Key properties of the device layers include:
(1) A substrate (e.g., SiC, $Al_2O_3$ or bulk GaN).
(2) The first cap layer and the layer 210 and the layer 214 reducing gate leakage.
(3) The second cap layer enhancing access region conductivity and reducing dispersion.
(4) The gate having a foot or comprising a foot gate aligned to the recess 213.

Figure 2:
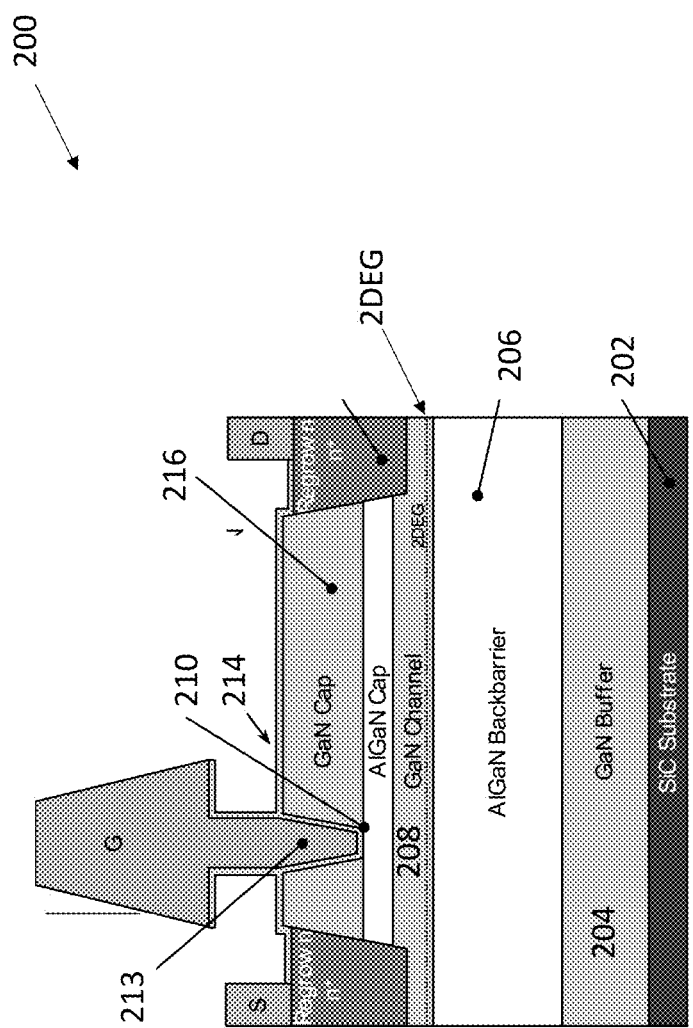
FIG. 2. Device Cross-section schematic of the N-polar GaN Deep Recess MISHEMT structure.

As illustrated in FIG. 2, electron conduction occurs on top of the barrier layer as illustrated in FIG. 2. In the example of FIG. 2, the GaN channel is relaxed as it has the same lattice constant as the GaN buffer layer. In one or more embodiments of the present invention described herein, the GaN buffer layer 204 is replaced by an (Al,Ga,In,Sc,Y)N layer with a lattice constant larger than GaN, for example InGaN. Thereby the entire buffer layer can be replaced by relaxed (Al,Ga,In,Sc,Y)N with a lattice constant larger than GaN or a relaxed (Al,Ga,In,Sc,Y)N layer can be formed on top of a GaN layer, for example [5,6]. All forthcoming layers are then grown coherently strained to the (Al,Ga,In,Sc,Y)N layer with a lattice constant larger than GaN, as illustrated in FIG. 3B for a structure 300 where the buffer layer 204 comprising a relaxed InGaN layer is positioned on a GaN base layer 203. Layers 204, 206, 208 all have an in-plane "a" lattice constant (a1) that is greater than the in plane "a" lattice constant $a_0$ of the base layer 203 that would consist of GaN. In one or more examples, the base layer 203 comprises a GaN substrate, is grown on a GaN substrate, or is grown on a lattice mismatched foreign substrate.

Figures 4A, 4B:
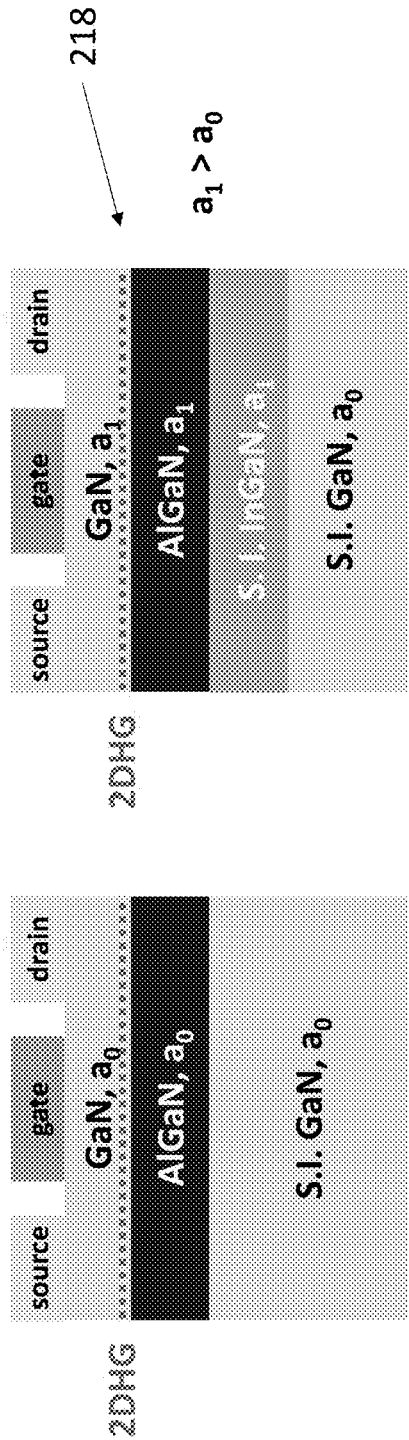
FIGS. 4A-4B. Schematic structures of standard Ga-polar p-FET with relaxed GaN channel (FIG. 4A) and novel Ga-polar p-FET with tensile strained GaN channel layer (FIG. 4B), resulting in a lower effective hole mass and increased hole mobility, showing 2DHG (two dimensional hole gas).

The schematic structure in FIG. 3B further illustrates designs for n-FETs based on N-polar GaN, and FIG. 4A-4B show the schematic structures for p-FETs based on Ga-polar GaN. Further layers can be grown on top of the GaN channel layers as illustrated in FIG. 2. Any suitable method can be used for the fabrication of the relaxed (Al,Ga,In,Sc,Y)N layer 204 underneath the "active" FET layers. If the desired channel thickness is larger than the critical GaN thickness of the respective bottom or base layer 203, the method described via FIGS. 8 and 9 and as described in the third example can be used, taking advantage of porous GaN.

In one or more examples, S.I. GaN layer 203 of FIG. 3B, 4B could also be porous GaN or could contain or comprise porous GaN. (S.I GaN can be semi-insulating GaN, for example).

Second Example

Figure 5A:
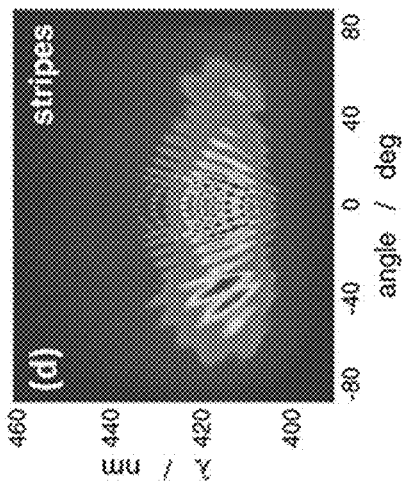
FIG. 5. Reciprocal space maps recorded around the asymmetric (1124) reflection for (a) the nanopillar array fabricated from a 8 period MQW wafer with 9.2 nm-thick GaN barriers and 2.7 nm-thick In0.25Ga0.75 N wells, (a) the nanostripe array fabricated from the same wafer with an angle of 90° between the stripes and the X-ray scattering plane. The RSM (b) was taken from the same nanostripe array around the asymmetric (10-15) reflection with the X-ray scattering plane parallel to the stripes (rlu: reciprocal lattice units), from [7]. (c) TEM image of nanostripe array, From [8]. (d) Angular resolved PL spectra recorded from nanostripe arrays fabricated from 5 period MQW fins, from [8].
Figure 5B:
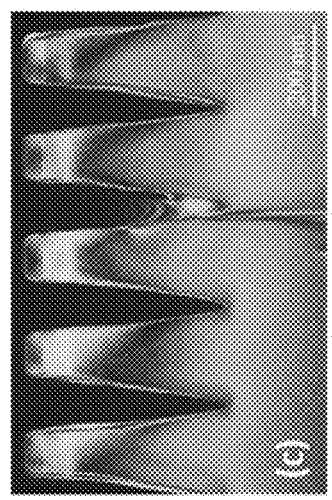
Figure 5C:
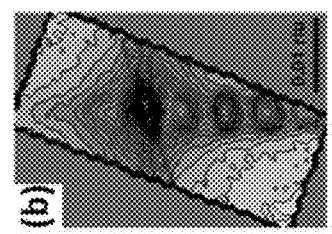
Figure 5D:
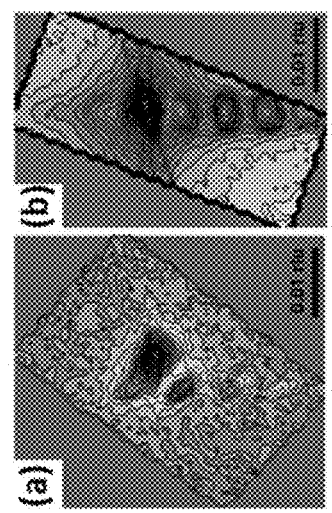

In another example, alternately to the growth on planar relaxed layers with an in-plane lattice constant larger than that of GaN, a larger lattice constant than that of GaN can be created through formation of nanofeatures such as nanofins from suitable strained heterostructures. For example, we have demonstrated uniaxially relaxed multi quantum well stacks by using strain relaxation in fin geometries as seen for an InGaN/GaN Multi Quantum Well (MQW) fin in FIG. 5 [7,8,9]. The MQW fin partially relaxes in the direction perpendicular to the stripe, while it remains fully strained parallel to the stripe direction. The etched stripe arrays were of high crystalline quality and exhibited intense photoluminescence as illustrated in FIG. 5D.

Figure 6:
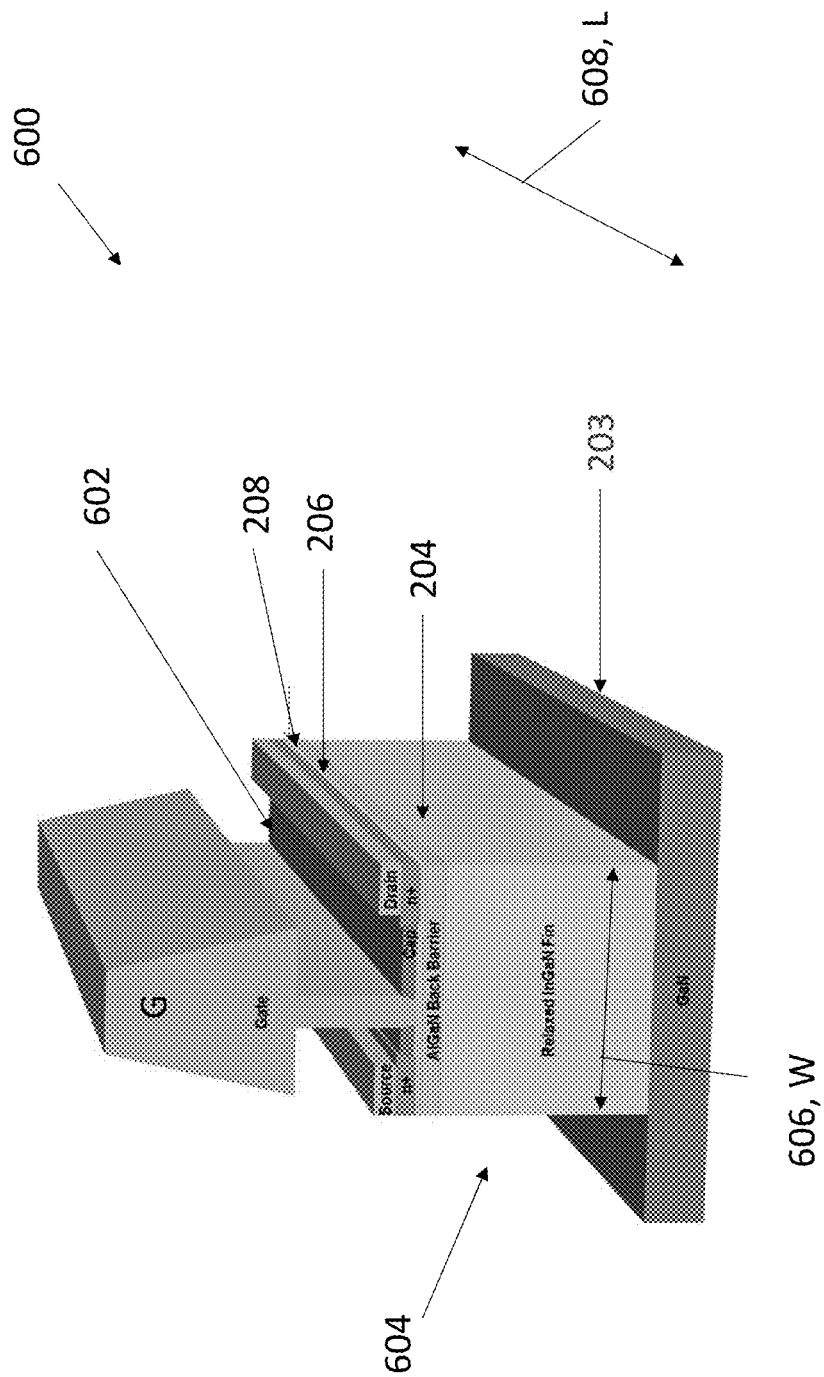
FIG. 6. Schematic of proposed Fin-structure applied to N-polar HEMT.
Figure 7:
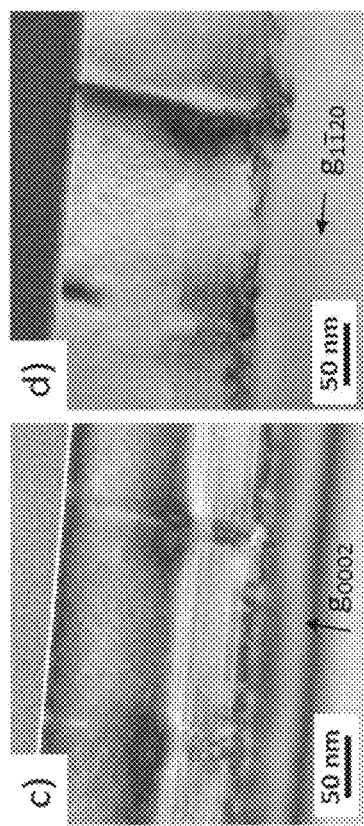
FIG. 7. Transmission electron microscopy images from patterned 7 period (5 nm In0.2Ga0.8N/6 nm GaN) MQW sample with 100 nm In0.1Ga0.9N top layer taken in (c) g=[0002] and (d) g=[11-20] conditions. From reference [9].

In contrast to a FinFET, in a device according to embodiments described herein, the electron transport direction is perpendicular to the fin direction (FIG. 6). The device of FIG. 6 comprises the base layer 203, first relaxed layer 204 (e.g., relaxed InGaN fin), barrier layer 206 (e.g., AlGaN) on the first relaxed layer, channel layer 208 (e.g., strained GaN layer) on the barrier layer, cap layer 602 (e.g., comprising layers 201 and/or 212) on the channel layer, and n+ material (e.g., 216). The small fin dimensions which are required for channel relaxation also impose a requirement for sub-micron ohmic contact length, about 100 nm. Therefore, an extremely low specific contact resistivity ($\rho_C$) is required. In the preferred embodiment using N-polar III-N orientation, record values of GaN HEMT contact resistance ($R_C$) of 27 Ω-µm, corresponding to $\rho_C$ of 2.3 Ω-µm$^2$, have already been demonstrated in a full N-polar GaN HEMT process [10].

Thereby the relaxed InGaN can not only be created via elastic relaxation of the InGaN layer as described above, but also via plastic relaxation, as illustrated in FIG. 6 for InGaN fins. As the relaxed InGaN fin is a passive part of the device structure, the defects which form in the bottom of the InGaN/GaN interface do not negatively affect the active part of the device structure. Relaxed fins have the advantage that this technique allows the fabrication of larger features, as the thickness of the "to be relaxed layer" can be significantly thinner than the fin width.

Thereby in the case of fins/stripes the material can remain strained along the stripe direction while it relaxes perpendicular to the stripe direction, as described in reference [9]. In the latter case carrier (electron/hole) transport needs to occur perpendicular to the stripe direction. In order to achieve transport of light holes with even lower effective mass, hole transport has to occur along the fins.

The process can be conducted on larger fins in the micrometer scale when porous GaN is used for the fabrication of the relaxed or partially relaxed (In,Ga,Al,Sc,Y)N fin. In this case the GaN bottom layer 203 in FIG. 6 is replaced by porous GaN. Using porous GaN to relax the InGaN base, current flow can occur perpendicular or parallel to the stripe or fin direction. If the desired GaN channel thickness is larger than the critical thickness on the respective (In,Ga,Al)N layer underneath, the method described in FIG. 8 and as described in the third example can be used again.

Third Example

FIG. 8 illustrates a method of making a device 800 with tensile strained GaN channel 208 using a porous layer 802. The method is particularly attractive for fabricating devices with a GaN channel thickness which is larger than the critical thickness when growing on an relaxed or partially relaxed (In,Ga,Al)N base layer. The method includes, as shown in FIG. 8(b), forming an epitaxial structure comprising a porous GaN layer 802, L2 (having in plane lattice constant a1) on a GaN substrate 203 (having in plane lattice constant a1), a first GaN 804 layer on the porous GaN; a first layer 210 (e.g., cap layer) comprising an AlGaN layer (AlGaN 2 having in plane lattice constant a1) on the first GaN layer 804; a channel layer 208 comprising a GaN layer on the AlGaN 2 layer (a cap layer); another layer 206 (e.g., AlGaN 1 having lattice constant a1, e.g., a barrier layer or AlGaN barrier layer) on the GaN channel layer 208; and a thin InGaN 806 layer (having lattice constant a1 acting as seed layer for the thick InGaN stressor layer 818) on the AlGaN 1 layer 206. In this way, InGaN stressor layer comprises layer 204 in FIG. 2, 3B, or 4B and the barrier layer 206 confines the charge (e.g., 2DEG/2DHG) in the channel layer 208. In some examples, the first InGaN seed layer 806 can be omitted. FIG. 8C illustrates etching a stripe 808 or mesa 810 through the epitaxial structure followed by the growth of the remainder of the InGaN stressor layer 818 with lattice constant $a_2$. Afterwards the entire structure adopts a lattice constant a2>a1. FIG. 8D illustrates removing the GaN substrate 202 (e.g., by etching or peeling), and FIG. 8E illustrates removing the porous GaN 802 and the first GaN layer 804 (e.g., by etching) to obtain the target structure 800 shown in FIG. 8A.

Similarly, a structure with a GaN channel under compression is described in FIG. 9. Here uniaxial strain will be desired for the formation of light holes, what can be achieved by using fin patterns with the hole transport occurring along the fin.

FIG. 10A-10E illustrate top view of devices 200 including example tile 1000 and tile patterns 1002 (e.g., for biaxial strain), wherein FIG. 10A illustrates square tiles and patterns, FIG. 10B illustrates triangular tiles and tile patterns, FIG. 10C illustrated hexagonal tiles and tile patterns, and FIG. 10D illustrates trapezoidal tiles and tile patterns.

A variety of devices may be fabricated using this method. Examples include, but are not limited to, the following (referring also to FIGS. 2-9).

1. A device 800, comprising:
   a porous III-V layer 802; and
   an active region 812 including a channel layer 208 grown as a strained layer on or above the porous III-V layer 802, wherein the channel layer changes its lattice constant becoming a re-strained layer upon pattern etching 808 and 810 deposition of a stressor 806 and 818 on or above the channel layer 208.

2. The device of example 1, wherein the porous III-V layer 802 comprises gallium nitride and the stressor layer comprises indium gallium nitride (InGaN) or a layer comprising two or more of Al, Ga, In, and N.

3. The device of example 1 or 2, wherein the porous III-V layer 802 comprises gallium nitride and the channel layer 208 comprises gallium nitride.

4. The device of example 3, wherein the stressor layers 806 and 818 comprise a material different from InGaN.

5. The device of any of the examples 1-4, further comprising an additional layer 804, 204 between the porous III-V layer and the channel layer.

6. The device of example 5, wherein the additional layer 804 comprises gallium nitride.

7. The device of any of the examples 1-6, further comprising the porous III-V layer 802 on or above a growth substrate 202, wherein the channel layer 208 has a thickness greater T than a critical thickness for growth of the channel layer directly on the growth substrate.

8 The device 800 of any of the examples 1-7, wherein the active region 812 includes an aluminum gallium nitride (AlGaN) barrier 210 confining a two dimensional hole gas 2DHG or a two dimensional electron gas 2DEG in the channel layer 208 comprising gallium nitride.

8b. The device of any of the examples 1-7, wherein the active region 812 includes an aluminum gallium nitride, (ScAlN), or (ScAlGa)N barrier 206 confining a two dimensional hole gas or a two dimensional electron gas in the channel layer comprising gallium nitride.

9. The device of any of the examples 1-8, further comprising a stripe 808 or mesa 810 etched through the seed stressor layer 806, 818 and the active region 812 down to the porous III-V layer 802, so that the mesa 810 or stripe 808 includes the seed stressor layer 806 and the active region 812 on which the remainder of the stressor layer 818 is deposited.

10. The device of any of the examples 1-9, wherein the porous III-V layer 802 comprises pores 816, patterns or features having a width of 1-1000 nanometers.

11. The device of example 10, wherein the pores 816 or patterns or features are etched.

12. The device of any of the examples, wherein the active region 812 (e.g., barrier 206 layer and/or channel layer 208) comprises scandium (sc), aluminum, indium, and/or gallium.

13. The device of any of the examples, wherein the stressor layer 806, 818 is any suitable material—it could, for example, also be a foreign material such as, but not limited to, silicon nitride.

14. The device of any of the examples 1-13, wherein the stressor layer comprises InGaN or AlGaN, and the tile or mesa has any geometry to obtain the channel layer that is biaxially strained.

15. The device of any of the examples 1-13, wherein the stressor layer comprises InGaN or AlGaN, and the tile or mesa comprises the stripe to obtain the channel layer that is uniaxially strained.

16. The device of any of the examples 21-31, wherein the stressor layer comprises AlGaN in a p-type transistor conducting light holes in the channel comprising a GaN channel.

17. The device of any of the examples, wherein, in addition to the "deposited stressor," additional stressors are used to achieve the desired lattice constant.

Example Modifications and Variations

While the uniaxial strain conditions described in the fin examples hold for epitaxial layer structure grown in the (0001) or c-direction as well as in the (000-1) or –c-direction, similar strain conditions can be used/established in devices grown in non-c-plane directions.

The epitaxial layer structures can be fabricated by any technique, for example metal-organic chemical vapor deposition, molecular beam epitaxy, pulsed sputtering, or hydride vapor phase epitaxy, for example.

The relaxed InGaN or (Al,Ga,In)N layers, or stripes, or features of any geometry, with a larger lattice constant than GaN can be formed by any technique.

For structures based on hole transport, the relaxed AlGaN, AlN, or (B,Al,Ga,In)N layers, or stripes, or features of any geometry, with a smaller lattice constant than GaN can be formed by any technique.

Instead of bulk (Al,In,Ga)N layers, suitable (Al,In,Ga)N multi quantum well stacks can be used.

Instead of full relaxation, partially relaxed layers can be used.

In one or more examples, the barrier and channel materials as well as the base layer (e.g., layer, e.g., porous layer, on the substrate) can be composed of any suitable nitride or other material. For example the channel could comprise AlN and the barrier of BAlN, both strained to GaN, to decrease the effective electron or hole masses in AlN.

The individual layers can be replaced by any (Sc,Y,B,Al,Ga,In)(N,P,As) material which fulfills the requirements regarding band gaps (barrier layers need to have a higher bandgap than the channel material) and lattice constants.

The relaxed (Sc,Y,B,Al,In,Ga)N layers can be of any suitable crystal orientation and FETs can be fabricated using any crystal orientation.

In one or more examples, the active region comprises a barrier layer comprising an alloy including Scandium (Sc) or Yttrium (Y) or transition metal nitrides in general, wherein the barrier layer adjacent the channel layer confines charge (e.g., a two dimensional electron or hole gas) in the channel layer. In one example, the active region comprises a barrier layer comprising ScAlN adjacent a channel layer, wherein the barrier layer confines charge (e.g., a two dimensional electron or hole gas) in the channel layer.

Further Device Embodiments

Further device embodiments include, but are not limited to, the following (referring also to FIGS. 2-9).

1. An electronic device 200, 300, 400, 600, 800, 900, comprising:
a substrate 202;
a group III-V layer 204 on or above the substrate, wherein the III-V layer has an in-plane lattice constant that is greater than that of gallium nitride and/or wherein the III-V layer is at least partially relaxed; and
an active region 218 including a coherently strained group III-V channel layer 208 on or above the III-V layer; wherein electron mobility or hole mobility in the channel layer is enhanced or increased by the strain.

2. The electronic device of example 1, wherein the strain in the channel layer is tensile strain.

3. The electronic device of examples 1 or 2, wherein the III-V layer 204 comprises a III-Nitride buffer layer including a material different than gallium nitride.

4. The electronic device of examples 1, 2 or 3, wherein the buffer layer 204 comprises InGaN or AlGaN or AlN.

5. The electronic device 600 of examples 1 or 2, wherein the III-V layer 204 comprises a stripe or fin 604, wherein the fin or stripe is relaxed in the direction 606 perpendicular to the stripe or fin and remains fully strained in a direction 608 parallel to the stripe direction.

6. The electronic device of example 5, wherein the stripe 604 or fin is etched.

7. The electronic device of examples 5-6, wherein the electron or hole transport direction is perpendicular to the stripe (along the relaxed direction 606).

8. The electronic device 600 of example 5 comprising a transistor including a source and drain on opposite sides of the stripe or fin and a gate on top of the stripe, so that the gate controls flow of current through the channel across a width of the stripe or the fin between the source and the drain.

8b. The electronic device 600 of examples 5-6, wherein the light hole transport direction 608 is parallel to the stripe (along the still strained direction 608).

9. The electronic device of examples 5-8, wherein the channel layer and/or the III-V layer have a thickness T less than the width W of the stripe or the fin.

10. The electronic device of examples 5-9, wherein the III-V layer 204 comprising the fin or the stripe includes a multi quantum well.

11. The electronic device of examples 5-10, wherein the fin 604 or the stripe 808 has a width W in a range of 1-1000 nanometers.

12. The electronic device of examples 5-11, wherein the fin 604 or the stripe 808 comprises the group III-V layer comprising InGaN 204 and/or the fin/InGaN comprises a passive portion of the device 600.

13. The electronic device of examples 1-12 comprising a transistor 600, further including a source contact to the channel layer, a drain contact to the channel layer, and a gate contact to the channel layer, wherein the gate controls flow of current comprising the holes or the electrons flowing through the channel layer 208 between the source and the drain.

14. The electronic device of examples 1-13, wherein the channel layer 208 comprises InGaN or GaN.

15. The electronic device of examples 1-14, wherein the group III-V layer 204 is relaxed through plastic relaxation or elastic relaxation.

16. The electronic device of examples 1-15, wherein the group III-V layer 204 comprises III-Nitride having an in-plane lattice constant greater than that of gallium nitride and the channel layer 204 comprises III-Nitride.

17. The electronic device of examples 1-16, wherein the group III-V layer 204 and the channel layer 208 comprise (B,Al,Ga,In)(N,P,As) material fulfilling requirements regarding band gaps (barrier layer(s) 206 need to have a higher bandgap than the material of the channel layer 208) and lattice constants.

18. The electronic device 200, 300, 400, 600, 800, 900 of any of the examples 1-17, wherein the active region 218 comprises an AlGaN barrier 206 confining electrons or holes in the channel layer 208 comprising GaN.

19. The electronic device of any of the examples 1-18, wherein the III-V layer 204 and the active layer/region 218 comprise III-Nitride have an N-polar, a Ga-polar, a non-polar, or a semi-polar orientation.

20. The electronic device of any of the examples 1-19, wherein the substrate 202 comprises gallium nitride.

21. A device 900, comprising:
a porous III-V layer 802; and
an active region 812 including a channel layer 208 grown as a strained layer on or above the porous III-V layer 802, wherein the porous layer 802 enables the formation of a relaxed or partially relaxed layer 204 or layer stack 204 with a lattice constant larger or smaller than GaN.

22. The device of example 32, wherein the relaxed or partially relaxed layer or layer stack 204 comprises a base layer having a lattice constant different to GaN to which the channel layer 208 comprising a GaN channel is strained, wherein the channel layer 208 is between the relaxed or partially relaxed layer or layer stack 204 and the porous III-V layer 802.

23. The electronic device of example 21 or 22, wherein the strain in the channel layer 208 is tensile strain.

24. The electronic device of example 21 or 22, wherein the strain in the channel layer 208 is compressive strain (as in FIG. 9).

25. The electronic device of any of the examples 21-24, wherein porous III-V layer 802 comprises gallium nitride.

26. The electronic device of any of the examples 21-25, further comprising a stripe 808, tile 810, or fin 604 comprising the relaxed or partially relaxed layer 204 or layer stack including on the porous GaN.

27. The electronic device of any of the examples 21-26, wherein the electron and hole transport can occur along a fin 604 or in any direction 606, 608 with respect to the etched pattern 808, 810. In one or more examples, the carrier transport can occur in any direction in the pattern-possible when using porous GaN in some examples because the entire etched pattern can biaxially relax and there is not a favorite direction as far as electron transport is concerned (while light holes require uniaxial relaxation).

28. The electronic device of examples 21-28, wherein the relaxed or partially relaxed layer 204 (e.g., comprising a layer stack) comprises a stripe 604 or fin, wherein the fin or stripe 604 is relaxed in the direction 606 perpendicular to the stripe 604 or fin and remains fully strained in a direction parallel 608 to the stripe direction.

29. The electronic device of example 28, wherein the stripe 604 or fin is etched.

30. The electronic device of any of the examples 28-29, wherein the electron or hole transport direction 606 is perpendicular to the stripe (along the relaxed direction).

31. The electronic device of any of the examples 28-30 comprising a transistor 600 including a source and drain on opposite sides of the stripe or fin and a gate on top of the stripe, so that the gate controls flow of current through the channel across a width W of the stripe 808 or the fin 604 between the source and the drain.

32. The electronic device of any of the examples 26-30, wherein the channel layer 208 and/or the III-V layer 204 have a thickness T less than the width W of the stripe 808 or the fin 604.

33. The electronic device of any of the examples 26-30, wherein the relaxed or the at least partially relaxed layer 204 comprising the fin 604 or the stripe 608 includes a multi quantum well.

34. The electronic device of any of the examples 26-30, wherein the fin 604 or the stripe 808 has a width W in a range of 1-1000 nanometers.

35. The electronic device of any of the examples 26-30, wherein the fin 604 or the stripe 808 comprises the first layer 204 comprising InGaN and comprising a passive portion of the device.

36. The electronic device of any of the examples 21-35 comprising a transistor 600, 200, 400, further including a source contact to the channel layer 208, a drain contact to the channel layer, and a gate contact to the channel layer, wherein the gate controls flow of current comprising the holes or the electrons flowing through the channel layer 208 between the source and the drain.

37. The electronic device of any of the examples 21-36, wherein the channel layer 208 comprises InGaN or GaN.

38. The electronic device of any of the examples 21-37, wherein the relaxed or at least partially relaxed layer 204 is relaxed through plastic relaxation or elastic relaxation.

39. The electronic device of any of the examples 21-38, wherein the relaxed or at least partially relaxed layer 204 comprises III-Nitride having a lattice constant greater than that of gallium nitride and the channel layer 208 comprises III-Nitride (e.g., GaN).

40. The electronic device of any of the examples 21-39, wherein the relaxed or the at least partially relaxed layer 204 and the channel layer 208 comprise (Sc,Y,B,Al,Ga,In)(N,P, As) material fulfilling requirements regarding band gaps (barrier layers 206 need to have a higher bandgap than the material in the channel layer 208) and lattice constants.

41. The electronic device of any of the examples 21-40, wherein the active region 218, 812 comprises an AlGaN, InAlN, or ScAlN barrier 206 or any (Sc,Y,B,Al,Ga,In)N alloy confining electrons or holes in the channel layer 208 comprising GaN.

42. The electronic device of any of the examples 21-41, wherein the relaxed or the at least partially relaxed layer 204 and the active layer 218, 812 comprise III-Nitride have an N-polar, a Ga-polar, a non-polar, or a semi-polar orientation.

43. The electronic device of any of the examples 21-42, wherein the relaxed or the at least partially relaxed layer 204 comprises at least two of Sc, Y, B, Al, Ga, In, and N.

44. The device of any of the examples 21-43, wherein the stressor layers 806 and 818 comprise any suitable material including, but not limited to, a foreign material such as, but not limited to, silicon nitride.

45. The device of any of the examples 21-44, further comprising one or more additional stressor layers 806 and 818 deposited to achieve the desired lattice constant.

46. The device of any of the examples 1-45, further comprising the active region 218, 812 including a barrier layer 206 on or above a channel layer 208, wherein the barrier layer 206, the channel layer 208, and the base layer 203, and/or layer 804 comprise any suitable nitride or other material.

47. The device of example 46, wherein the channel layer 208 comprises AlN and the barrier layer 206 comprises BAlN, both strained to GaN, to decrease the effective electron or hole masses in the channel layer 208 comprising AlN.

48. The device of any of the examples 1-47, wherein the active region 218, 812 comprises a barrier layer 206 comprising an alloy including Yttrium or transition metal nitrides in general, and the barrier layer 206 adjacent the channel layer 208 confines charge (e.g., a two dimensional electron or hole gas) in the channel layer 204.

49. The device of example 48, wherein the active region comprises a barrier layer 206 comprising ScAlN adjacent a channel layer 208, and the barrier layer 206 confines charge (e.g., a two dimensional electron or hole gas) in the channel layer 208.

50. A device where the channel layer is compressively strained.

51. A device where the hole transport occurs along (parallel to) the stripe.

52. A transistor (e.g., n-FET) with enhanced/increased mobility in a GaN channel, where the in-plane lattice constant of the GaN is larger than in its relaxed state, by growing the "active part of the device structure (e.g., active region 218, 208)" coherently strained to a material 204 with a larger lattice constant than GaN such as InGaN.

Example Process Steps

Figure 11:
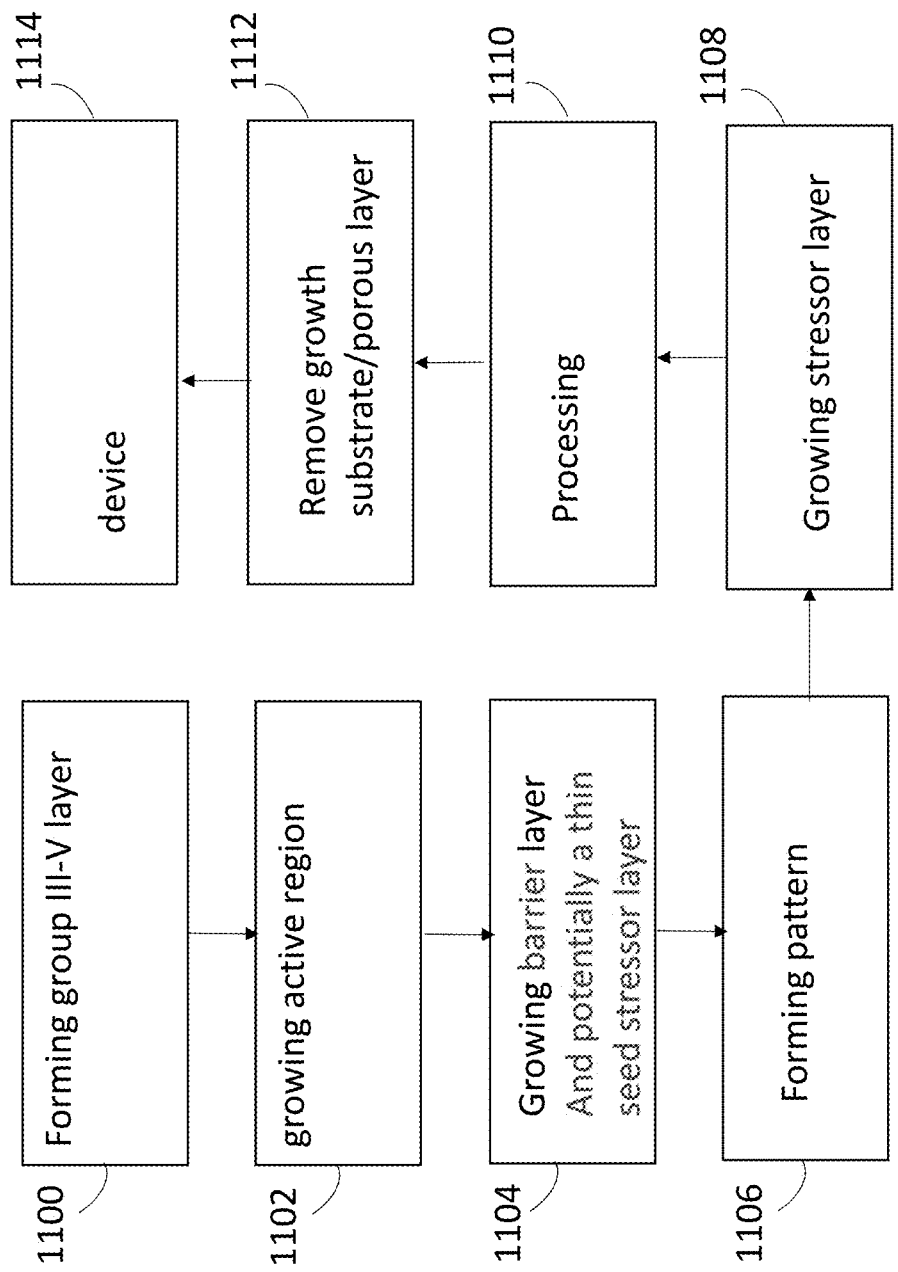
FIG. 11. Flowchart illustrating a method of making a device.

FIG. 11 is a flowchart illustrating a method of making a device according to one or more examples.

Block 1100 represents forming (including growing), on a substrate or porous layer on a substrate, a group III-V layer 204. In one or more examples, the III-V layer has the same in-plane lattice constant as the material which forms the porous layer. In other examples, the III-V layer has an in-plane lattice constant that is larger or smaller than of gallium nitride and wherein the III-V layer 204 is at least partially relaxed. In some examples, the group III-V layer comprises a bulk InGaN substrate or a bulk substrate different from GaN. In other examples, the group III-V layer comprises a layer grown on a substrate (e.g., foreign substrate) with sufficient thickness that the group III-V layer becomes at least partially relaxed.

Block 1102 represents growing, on the group III-V layer, an active region 218, 812 including the group III-V channel layer 208 on or above the group III-V layer 204, 206; wherein an electron mobility or a hole mobility in the channel layer 208 is increased by the strain.

Block 1104 represents optionally growing a cap layer on the active region.

Block 1106 represents optionally growing a stressor layer on the cap layer. In one or more examples, the stressor layer comprises InGaN or AlGaN or a material different from InGaN. In one or more examples, the stressor comprises a seed stressor and a main stressor layer on the seed stressor layer.

Block 1108 represents optionally forming (e.g., etching) a pattern into the epitaxial structure (e.g., forming a stripe or tile in the epitaxial structure). In one or more examples etching or formation of the pattern enables the porous layer to expand so as to strain the channel layer and/or relax the stressor layers (if present).

Block 1110 represents processing the epitaxial structure into an electronic device, including, for example, forming source and drain contacts and a gate contact.

Block 1112 represents optionally removing the substrate and/or porous layer.

Block 1114 represents the end result, an electronic device. Example devices include, but are not limited to, the following (referring also to FIGS. 2-9).

1. A device, comprising:
   a group III-V layer 204 wherein the III-V layer has an in-plane lattice constant that is larger or smaller than that of gallium nitride and wherein the III-V layer 204 is at least partially relaxed; and
   an active region 218, 812 including a coherently strained group III-V channel layer 208 on or above the group III-V layer 204; wherein an electron mobility or a hole mobility in the channel layer 208 is increased by the strain.

2a. The device of example 1, wherein:
   the active region 812, 218 comprises a barrier layer 206 confining a two dimensional electron gas or a two dimensional hole gas in the channel layer 208, and
   the barrier layer comprises at least one of AlN, AlGaN, InAlN, ScAlN or an alloy combination of the AlN, AlGaN, InAlN, ScAlN and the channel layer comprises GaN, where the GaN channel layer is strained and has an in-plane lattice constant larger than in a relaxed state to decrease the effective electron mass or the effective hole mass in the channel layer.

2b. The device of example 1, wherein the active region 812, 218 comprises a barrier layer 206 confining a two dimensional electron gas or a two dimensional hole gas in the channel layer 208, and
   the channel layer 208 comprises AlN and the barrier layer comprises BAlN, both the barrier layer and the channel layer strained to GaN to decrease the effective electron or hole masses in the channel layer.

2c. The device of example 1 wherein the III-V layer and the active region comprise (Sc,Y,B,Al,Ga,In)(N,P,As) material and the active region comprises a barrier layer 206 having a higher bandgap than the channel layer 208.

2d. The device of example 1, wherein the active region 218, 812 comprises a barrier layer 206 comprising a III-Nitride including Yttrium or a transition metal nitride, the barrier layer adjacent the channel layer confining a two dimensional electron or hole gas in the channel layer.

3. The device of any of the examples 1-2, further comprising a cap layer 210 on the channel layer 208.

4. The device of example 1 or 2, wherein the group III-V layer 204 comprises a first AlGaN layer (AlGaN 1), the channel layer 208 comprises GaN, the device further comprises a second AlGaN layer 210 (AlGaN layer 2) on the channel layer 208 having the same lattice constant as the AlGaN 1 layer. A 2 dimensional hole gas forms at the AlGaN1/GaN interface, the bottom AlGaN1 layer also serves as barrier layer 206 and the AlGaN2 layer is a cap layer 210 e.g., to mitigate gate leakage, for example.

5. The device of any of the examples 1-4, further comprising the porous layer 802 comprising gallium nitride.

6. The device of any of the examples, 1-5, further comprising the channel layer 208 comprising gallium nitride or InGaN.

7. The device of any of the examples 1-4, further comprising a seed stressor layer 806 and a main stressor layer 818 on or above the channel layer 208, the stressor layer having a stressor lattice constant further straining the channel layer so as to change a lattice constant of the channel layer 208.

8 The device of example 7, wherein the porous layer 802 comprises gallium nitride and the stressor seed layer 806 and the main stressor layer 818 comprise InGaN or AlGaN or a layer comprising two or more of Al, Ga, In, and N.

9. The device of any of examples 7-8, wherein the seed stressor layer 806 and the main stressor layer 818 comprises a material different from InGaN, the III-V layer 204 comprises III-Nitride having a lattice constant greater than that of gallium nitride, and the channel layer 208 comprises III-Nitride.

10. The device of any of the examples 7-9, further comprising a mesa 814 comprising a stripe 808, or tile 810 etched or formed through the stressor seed layer 806 and the active region 812 down to the porous III-V layer 802, so that the mesa includes the stressor layer 806 and the active region 812 on which the remainder of the stressor layer 818 is deposited.

11. The device of any of the examples 7-10, wherein the stressor seed layer 806 and the main stressor layer 818 comprise InGaN or AlGaN, and the mesa 814 has a geometry allowing the channel layer 208 that is biaxially strained.

12. The device of any of the examples 7-10, wherein the stressor seed layer 806 and the main stressor layer 818 comprise InGaN or AlGaN, and the mesa 814 comprises the stripe 808 allowing the channel layer 208 that is uniaxially strained.

13. The device of any of the examples 1-12, further comprising the barrier layer comprising AlGaN (AlGaN 1) and an AlGaN cap layer 210 on the GaN channel layer 208, wherein the two dimensional electron gas forms at the AlGaN2/GaN interface and the AlGaN2 layer is also a cap layer to mitigate gate leakage.

14. The device of any of the examples 1-13, wherein the strain in the channel layer is tensile strain or compressive strain.

15. The device 600 of any of the examples 1-10 or 12-14, wherein the device comprises a transistor including a source, a drain, and a gate, the device further comprising:

a mesa 814 comprising a stripe 604 including the group III-V layer 204, wherein the source and the drain are on opposite sides of the stripe and the gate is on top of the stripe, so that the gate controls flow of current through the channel (e.g., 2DEG, 2DHG) across a width W of the stripe 604 between the source and the drain; wherein:

the stripe 604 is relaxed in the direction 606 perpendicular to the stripe (perpendicular to the Length L of the stripe) and remains fully strained in a direction 608 parallel to a stripe direction along a length L of the stripe, the electron or hole transport direction 606 is perpendicular to the stripe (along the relaxed direction 606), the channel layer 208 and/or the group III-V layer 204 (e.g., each) have a thickness T less than the width W of the stripe 604 (e.g., fin).

16. The device of any of the examples 1-10 or 12-14, wherein the device comprises a transistor including a source, a drain, and a gate, the device further comprising:

a mesa 814 comprising a stripe 808, 604 including the group III-V layer 204, wherein the source and the drain are on opposite sides of a length of the stripe and the gate is on top of the stripe, so that the gate controls flow of current through the channel (e.g., 2DEG, 2DHG) along the length L of the stripe between the source and the drain; wherein:

the stripe 604 remains strained or partially strained in the direction parallel 608 to the stripe direction along the length L of the stripe (e.g, fin) and is relaxed in a direction perpendicular 606 to the stripe direction 608, the hole transport direction is parallel to the length L of the stripe (along the relaxed direction 608), and the channel layer 208 and/or the III-V layer 204 (e.g., each) have a thickness T less than the length L of the stripe 604 (e.g., fin).

17. The device of any of the examples 1-16, wherein the group III-V layer 204 comprises a multi quantum well and/or the 604 stripe has a width W in a range of 1-1000 nanometers.

18. The device of any of the examples 1-17, comprising the porous layer 802 on or above the substrate 200, wherein the channel layer 208 has a thickness T greater than a critical thickness for growth of the channel layer directly on the substrate 200.

19. The device of any of the examples 1-18, wherein the porous layer 802 comprises pores 816, patterns or features having a width of 1 nanometers-1000 micrometers and the pores or patterns or features are etched.

20. The device of example 1, further comprising an etched pattern 814 comprising the group III-V layer 204 and the porous layer 802, wherein the electron and hole transport occurs along any predetermined direction in the etched pattern.

21. The device of any of the examples, wherein the device comprises a transistor (e.g., field effect transistor, or high electron mobility transistor).

22. The device of claim 21, wherein the device includes source and drain contacts positioned so that the current is passed between the source and drain along a direction wherein the electron mobility or a hole mobility in the channel layer is increased by the strain.

23. The device of any of the examples grown on a bulk InGaN substrate or wherein the group III-V layer comprises a bulk InGaN substrate or bulk substrate having a composition different from GaN, or a III-Nitride layer grown on a foreign substrate and having a thickness sufficient for the III-Nitride layer to relax.

24. The device of any of the examples 1-23, wherein the device comprises an n-type field effect transistor having an N-polar orientation and the active region (including the channel layer and the barrier layer) has the N-polar orientation and the barrier layer is between the channel layer and the group III-V layer.

25. The device of any of the examples 1-23, wherein the device comprises a p-type field effect transistor having a Ga-polar orientation and the active region (including the channel layer and the barrier layer) has the Ga polar orientation and the barrier layer is between the channel layer and the group III-V layer.

Advantages and Improvements

Using a strained channel in a group III-nitride transistor, e.g., straining the binary GaN so that it adopts a larger in-plane lattice constant, allows enhancement/increase of the electron mobility. In one or more examples, use of an relaxed InGaN underlayer is also attractive for the N-polar growth direction as the 2DEG (two dimensional electron gas) forms on top of the barrier layer, separating the lower band gap InGaN layer from the relatively higher band gap GaN channel.

Recording X-ray diffraction reciprocal space maps allows the determination of the in-plane and out-of plane lattice constants and determination of whether a layer is relaxed, partially relaxed, or strained.

Nomenclature

GaN and its ternary and quaternary compounds incorporating aluminum (Al) and indium (In) (AlGaN, InGaN, AlInGaN) are commonly referred to using the terms (Al, Ga,In)N, III-nitride, III-N, Group III-nitride, nitride, Group III-N, $Al_{(1-x-y)}In_yGa_xN$ where $0<x<1$ and $0<y<1$, or AlInGaN, as used herein. In addition, Scandium and Yttrium and other transition metal nitrides exist and alloys between transition metal nitrides and (Al,Ga,In)N can be formed (Al,Ga,In,Sc,Y)N. Boron nitride is another nitride which can form an alloy with (Al,Ga,In)N or (Al,Ga,In,Sc,Y)N. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga,Al,In) component species are present, all possible compositions, including stoichiometric proportions as well as "off-stoichiometric" proportions (with respect to the relative mole fractions present of each of the (Ga,Al,In) component species that are present in the composition), can be employed within the broad scope of the invention. Accordingly, it will be appreciated that the discussion of the invention hereinafter in primary reference to GaN materials is applicable to the formation of various other (Al,Ga,In)N material species. Further, (Al,Ga,In)N materials within the scope of the invention may further include minor quantities of dopants and/or other impurity or inclusional materials. Boron (B) may also be included.

Group III-V material comprises an alloy of group III and group V elements in the periodic table.

One approach to eliminating the spontaneous and piezoelectric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero 1 Miller index.

Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

A pseudo-substrate is an engineered wafer which can be used as base layer for the epitaxial growth of crystalline materials, for example, group-III nitrides or other semiconductor materials.

For a layer X grown on a layer Y, for the case of coherent growth or a strained layer, the in-plane lattice constant(s) of X are constrained to be the same as the underlying layer Y. If X is fully relaxed, then the lattice constants of X assume their natural (i.e. in the absence of any strain) value. If X is neither coherent nor fully relaxed with respect to Y, then it is considered to be partially relaxed.

REFERENCES

The following references are incorporated by reference herein.

[1] Brian Romanczyk, Steven Wienecke, Matthew Guidry, Haoran Li, Elaheh Ahmadi, Xun Zheng, Stacia Keller, Umesh K Mishra, IEEE Trans. Electron Devices 65. 45 (2018)

[2] G. Hendorfer and J. Schneider, Semicond. Sci. Technol. 6 (1991) 595.

[3] O. Laboutin, Y. Cao, W. Johnson, R. Wang, G. Li, D. Jena and H. Xing, Appl. Phys. Lett. 100 (2012) 121909.

[4] N. Okamoto, K. Hoshino, N. Hara, M. Takikawa, Y. Arakawa, J. Cryst. Growth 272 (2004) 278.

[5] K. Hestroffer, F. Wu, H. Li, C. Lund, S. Keller, J. S. Speck, U. K. Mishra, Semicond. Sci. technol 30 (2015) 105015.

[6] K. Hestroffer, C. Lund, O. Koksaldi, H. Li, G. Schmidt, M. Tippel, P. Veit, F. Bertram, N. Lu, Q. Wang, J. Christen, M. J. Kim, U. K. Mishra, s. Keller, J. Cryst. Growth 465 (2017) 55.

[7] S. Keller, N. A. Fichtenbaum, C. Schaake, C. J. Neufeld, A. David, E. Matioli, Y. Wu, S.P. DenBaars, J. S. Speck, C. Weisbuch, and U.K. Mishra, Phys. Status Solidi Basic Res. 244, 1797 (2007).

[8] S. Keller, N.A. Fichtenbaum, C. Schaake, C. J. Neufeld, Y. Wu, K. McGroddy, A. David, S. P. DenBaars, J. S. Speck, C. Weisbuch, and U. K. Mishra, J. Appl. Phys. 100, 054314 (2006).

[9] S. Keller, C. Lund, T. Whyland, Y. Hu, C. Neufeld, S. Chan, S. Wienecke, F. Wu, S. Nakamura, J.S. Speck, S.P. DenBaars, and U.K. Mishra, Semicond. Sci. Technol. 30, 105020 (2015).

[10] S. Dasgupta, Nidhi, D. F. Brown, F. Wu, S. Keller, J. S. Speck, U. K. Mishra, Appl. Phys. Lett. 96 (2010) 143504.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A transistor device structure, comprising:
an InGaN layer directly on a base layer, wherein the base layer is a substrate or a layer on or above a substrate and wherein the InGaN layer is at least partially relaxed;
an AlGaN backbarrier directly on the InGaN layer; and
an active region including a GaN channel layer directly on the AlGaN backbarrier;
wherein the GaN channel layer is coherently strained to the InGaN layer to increase an electron mobility or a hole mobility in the GaN channel layer and the AlGaN backbarrier provides confinement of charge in the GaN channel layer and wherein the GaN channel layer, the AlGaN backbarrier, and the InGaN layer all have an in-plane "a" lattice constant (a1) that is greater than the in plane "a" lattice constant $a_0$ of the base layer.

2. The device structure of claim 1, further comprising the base layer comprising a porous layer comprising gallium nitride.

3. The device structure of claim 1, further comprising the base layer comprising a porous layer on or above the substrate, wherein the channel layer has a thickness greater than a critical thickness for growth of the channel layer directly on the substrate.

4. The device structure of claim 1, further comprising the base layer comprising a porous layer comprising pores, patterns or features having a width of 1 nanometers-1000 micrometers, wherein the pores or patterns or features are etched and the InGaN layer is on the porous layer.

5. The device structure of claim 4, further comprising an etched pattern comprising the InGaN layer and the porous layer, wherein the electron and hole transport occurs along any predetermined direction in the etched pattern.

6. The device of claim 1, wherein:
the device structure comprises an n-type field effect transistor having an N-polar orientation and the active region (including the channel layer and the backbarrier) has the N-polar orientation and the backbarrier is between the channel layer and the InGaN layer, or
the device structure comprises a p-type field effect transistor having a Ga-polar orientation and the active region (including the channel layer and the backbarrier) has the Ga polar orientation and the backbarrier layer is between the channel layer and the InGaN layer.

7. The device structure of claim 1, further comprising:
a source contact and a drain contact positioned so that current is passed between the source contact and the drain contact along a direction determined by the strain.

8. The device of claim 7, further comprising a stressor layer on or above the GaN channel layer.

9. The device of claim 7, further comprising the backbarrier layer between the GaN channel layer and the stressor layer comprising a group III-V stressor layer.

10. The device structure of claim 1, wherein the base layer is gallium nitride.

11. The device of claim 1, wherein the base layer is gallium nitride on the substrate comprising a foreign substrate.

12. A transistor device structure, comprising:
a group III-V layer, wherein the group III-V layer has an in-plane lattice constant that is larger than that of gallium nitride and wherein the group III-V layer is at least partially relaxed;
a backbarrier on or above the group III-V layer; and
an active region including a group III-V channel layer on or above the backbarrier;
wherein the group III-V channel layer is a gallium nitride or AlN channel layer coherently strained to the group III-V layer to increase an electron mobility or a hole mobility in the group III-V channel layer and the backbarrier provides confinement of charge in the group III-V channel layer; and
further comprising a stressor layer on or above the group III-V channel layer, the stressor layer having a stressor lattice constant further straining the group III-V channel layer so as to change a lattice constant of the group III-V channel layer; and
further comprising a mesa comprising a stripe or tile formed through the stressor layer and the active region, so that the mesa includes the stressor layer and the active region.

13. The device structure of claim 12, wherein:
the active region comprises a barrier layer confining a two dimensional electron gas or a two dimensional hole gas in the channel layer,
the backbarrier comprises the barrier layer comprising at least one of AlN, AlGaN, InAlN, ScAlN or an alloy combination of the AlN, AlGaN, InAlN, ScAlN and the group III-V channel layer comprises GaN, where the GaN channel layer is strained and has an in-plane lattice constant larger than in a relaxed state to decrease the effective electron mass or the effective hole mass in the group III-V channel layer.

14. The device structure of claim 12 wherein the group III-V layer and the active region comprise (Sc,Y,B,Al,Ga,In)(N,P,As) material and the active region comprises a barrier layer having a higher bandgap than the group III-V channel layer.

15. The device structure of claim 12, wherein the active region comprises a barrier layer comprising a III-Nitride including Yttrium or a transition metal nitride, the barrier layer adjacent the channel layer confining a two dimensional electron or hole gas in the group III-V channel layer.

16. The device structure of claim 12, wherein the strain in the group III-V channel layer is tensile strain or compressive strain.

17. The device structure of claim 12, wherein the device structure comprises a transistor including a source, a drain, and a gate, the device structure further comprising:
a mesa comprising a stripe having a length longer than a width and including the group III-V layer and the active region, wherein the source and the drain are on opposite sides of the stripe and the gate is on top of the stripe, so that the gate controls flow of current through a channel in the group III-V channel layer across a width of the stripe between the source and the drain; wherein:
the stripe is relaxed in the direction perpendicular to the stripe and remains fully strained in a direction parallel to a stripe direction along the length of the stripe,
the electron or hole transport direction is perpendicular to the stripe (along the relaxed direction), and
the group III-V channel layer and/or the group III-V layer have a thickness less than the width of the stripe or the fin.

18. The device structure of claim 12, wherein the device structure comprises a transistor including a source, a drain, and a gate, the device structure further comprising:
a mesa comprising a stripe having a length longer than a width and including the group III-V layer and the active region, wherein the source and the drain are on opposite sides of the length of the stripe and the gate is on top of the stripe, so that the gate controls flow of current through the group III-V channel layer along the length of the stripe between the source and the drain; wherein:
the stripe remains strained or partially strained in the direction parallel to the stripe direction along the length of the stripe or fin and is relaxed in a direction perpendicular to the stripe direction,
the hole transport direction is parallel to the length of the stripe (along the relaxed direction), and
the group III-V channel layer and/or the group III-V layer have a thickness less than the length of the stripe or the fin.

19. The device of claim 12, wherein the group III-V layer comprises a multi quantum well and the stripe has a width in a range of 1-1000 nanometers.

20. The device of claim 12, further comprising a porous layer comprising gallium nitride, wherein the group III-V layer is on the porous layer and the stressor layer comprises InGaN or AlGaN or a layer comprising two or more of Al, Ga, In, and N.

21. The device structure of claim 12, wherein the stressor layer comprises a material different from InGaN, the group III-V layer comprises III-Nitride having a lattice constant greater than that of gallium nitride, and the channel layer comprises III-Nitride.

22. The device structure of claim 12, wherein the stressor layer comprises InGaN or AlGaN, and the mesa has a geometry allowing the group III-V channel layer that is biaxially strained.

23. The device structure of claim 12, wherein the stressor layer comprises InGaN or AlGaN, and the mesa comprises the stripe allowing the group III-V channel layer that is uniaxially strained.

24. The device structure of claim 12, wherein the group III-V channel layer is AlN, the backbarrier is BAlN and the group III-V layer is GaN or AlGaN.

25. A method of making a device, comprising:
growing an InGaN layer directly on a base layer comprising a substrate or a layer on or above a substrate, wherein the InGaN layer is at least partially relaxed;
growing an AlGaN backbarrier directly on the InGaN layer; and
growing an active region including a GaN channel layer directly on the backbarrier;
wherein the GaN channel layer is coherently strained to the InGaN layer to increase an electron mobility or a hole mobility in the GaN channel layer and the AlGaN backbarrier provides confinement of charge in the GaN channel layer and wherein the GaN channel layer, the AlGaN backbarrier, and the InGaN layer all have an in-plane "a" lattice constant (a1) that is greater than the in plane "a" lattice constant $a_0$ of the base layer.

* * * * *